(12) United States Patent
Yang

(10) Patent No.: US 11,322,467 B2
(45) Date of Patent: May 3, 2022

(54) MEMORY PACKAGE STRUCTURE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 54 days.

(21) Appl. No.: 16/899,568

(22) Filed: Jun. 11, 2020

(65) Prior Publication Data

US 2021/0391288 A1 Dec. 16, 2021

(51) Int. Cl.
| | |
|---|---|
| *H01L 23/00* | (2006.01) |
| *G11C 5/06* | (2006.01) |
| *H01L 23/498* | (2006.01) |
| *H01L 23/31* | (2006.01) |
| *H01L 23/64* | (2006.01) |
| *H01L 27/108* | (2006.01) |

(52) U.S. Cl.
CPC .............. *H01L 24/06* (2013.01); *G11C 5/063* (2013.01); *H01L 23/3107* (2013.01); *H01L 23/49816* (2013.01); *H01L 23/647* (2013.01); *H01L 27/10897* (2013.01); *G11C 2207/105* (2013.01); *H01L 2224/06515* (2013.01); *H01L 2924/1436* (2013.01)

(58) Field of Classification Search
CPC .............. H01L 24/06; H01L 27/10897; H01L 23/3107; H01L 23/647; H01L 23/49816; H01L 2924/1436; H01L 2224/06515; G11C 5/063; G11C 2207/105
See application file for complete search history.

(56) References Cited

U.S. PATENT DOCUMENTS

2015/0373848 A1\* 12/2015 Seok .................. G11C 5/04
361/679.31

\* cited by examiner

*Primary Examiner* — Marcos D. Pizarro
(74) *Attorney, Agent, or Firm* — CKC & Partners Co., LLC

(57) ABSTRACT

A memory package structure includes a substrate, a memory chip and a plurality of resistors. The substrate has a plurality of pins. The pins include a plurality of data pins used to transfer data signal. The memory chip is located on the substrate. A plurality of bonding pads is located on the memory chip. The bonding pads include a plurality of data pads used to receive the data signal from data pins or transfer the data signal from the memory chip. The resistors is located on the substrate. Each data pad is connected to a corresponding one of the data pins through a corresponding one of the resistors.

9 Claims, 6 Drawing Sheets

MEMORY PACKAGE STRUCTURE

BACKGROUND

Technical Field

The present disclosure relates to a memory package structure.

Description of Related Art

For double-data-rate fourth generation (DDR4) or LDDR4 dynamic random access memory (DRAM) under 20 nm processes or below, there is no continuous time linear equalizer used to reduce signal distortion, and signal distortion appears in high frequency data signal. For example, the signal distortion includes overshoot or undershoot phenomenon when the frequency of the high frequency data signal greater than 2933 MHz clock data rete.

Accordingly, how to improve the signal distortion including overshoot or undershoot phenomenon is a subject solved by those in the industry.

SUMMARY

One aspect of the present disclosure is related to a memory package structure.

According to one embodiment of the present disclosure, a memory package structure includes a substrate, a memory chip and a plurality of resistors. The substrate has a plurality of pins. The pins include a plurality of data pins used to transfer data signal. The memory chip is located on the substrate. A plurality of bonding pads is located on the memory chip. The bonding pads include a plurality of data pads used to receive the data signal from data pins or transfer the data signal from the memory chip. The resistors are located on the substrate. Each data pad is connected to a corresponding one of the data pins through a corresponding one of the resistors.

In one or more embodiments, each resistor has a resistance less than 100 ohm.

In one or more embodiments, the substrate includes a top surface and a bottom surface. The memory chip and the resistors are located on the top surface. The pins are solder balls located on the bottom surface, and the resistors are connected to the solder balls and the bonding pads of the memory chip through a plurality of circuits within the substrate. The circuits extend to the top surface and the bottom surface.

In some embodiments, the substrate further includes a through hole, the bonding pads of the memory chip face the top surface and align with the through hole. The bonding pads of the memory chip are connected to the circuit on the bottom surface through the through hole.

In one or more embodiments, the memory chip and the resistor are located on a top surface of the substrate. The resistors are located on two opposite sides of the memory chip.

In some embodiments, the package structure further includes a molding compound located on the top surface and covering the memory chip and the resistors.

In one or more embodiments, the bonding pads of the memory chip further includes data strobe pads and data mask pads, the data strobe pads are used to provide a differential pair signaling for the data signal during a read process and a write process of the memory chip. The data mask pads are used to input or output data mask signal to the memory chip. Each of the data strobe pads and the data mask pads is connected to a corresponding one of the pins through a corresponding one of the resistors.

In some embodiments, a number of the resistors is equal to a total sum of the data pads, the data strobe pads and the data mask pads.

In one or more embodiments, the bonding pads of the memory chip further include a plurality of command control pads. The command control pads are used to input control signal to the memory chip. Each of the command control pads is connected to a corresponding one of the pins through a corresponding one of the resistors.

In one or more embodiments, the bonding pads of the memory chip further include a plurality of addressing pads. The addressing pads are configured to achieve an addressing function to read/write a selected memory cell in the memory chip. Each of the addressing pads is connected to a corresponding one of the pins through a corresponding one of the resistors.

In summary, for the memory package structure, the data pads of the memory chip receive or transfer data signal through the resistor, and the overshoot phenomenon in the input/output of the data signal can be improved.

The above description is only used to explain the problems to be solved by the present disclosure, the technical means for solving the problems and the produced effects. The specific details of the present disclosure are described in detail in the following embodiments and related drawings.

BRIEF DESCRIPTION OF THE DRAWINGS

The drawings disclose one or more embodiments of the present disclosure and, together with the explanation in the description, serve to explain the principles of the present disclosure. Wherever possible, the same reference numbers will be used throughout the drawings to refer to the same or like elements in the embodiments. These drawings include.

DETAILED DESCRIPTION

The following embodiments are disclosed with accompanying diagrams for a detailed description. For illustration clarity, many details are explained in the following description. However, it should be understood that these details do not limit the present disclosure. That is, these details are not necessary in parts of embodiments of the present disclosure. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have their usual meaning as used in the field, in the context of the disclosure and in the context of the particular content unless particularly specified otherwise. Some terms used to describe the disclosure are discussed below or elsewhere in the specification to provide additional guidance related to the description of the disclosure to those in the art.

The phrases "first," "second," etc., are solely used to separate the descriptions of elements or operations with the same technical terms, and are not intended to convey a meaning of order or to limit the disclosure.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

Figure 1:
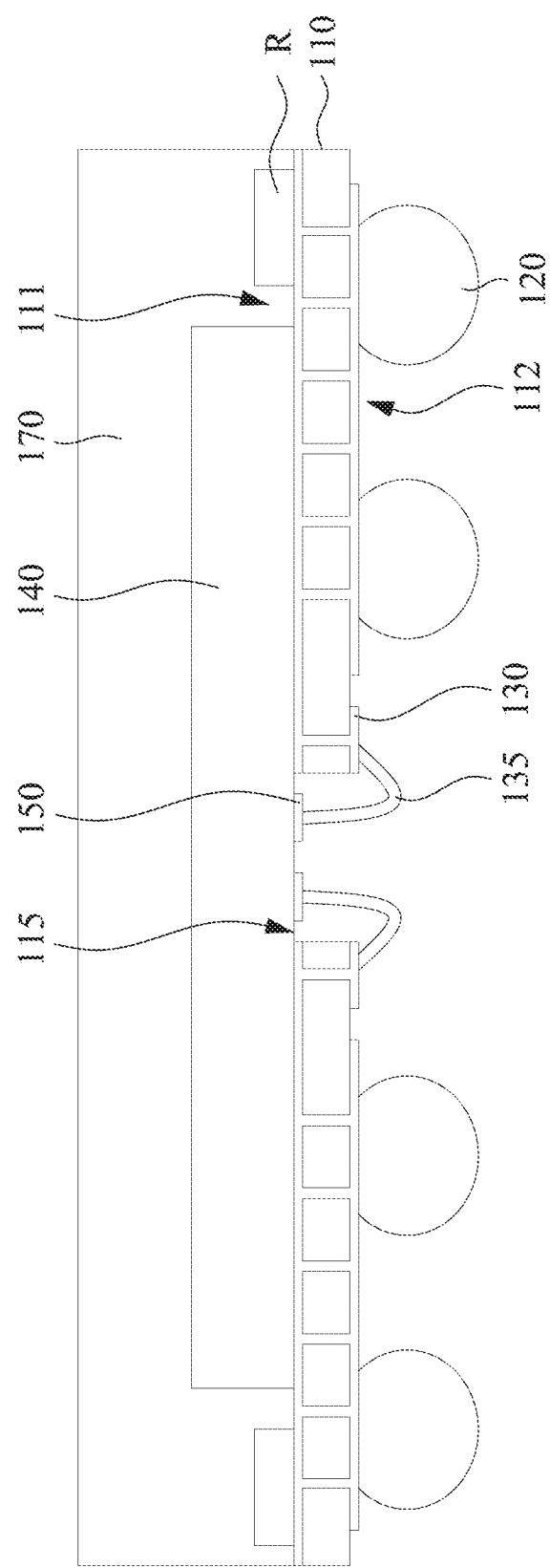
FIG. 1 is a cross-section view of a memory package structure according one embodiment of the present disclosure.

Reference is made by FIG. 1. FIG. 1 is a cross-section view of a memory package structure 100 according one embodiment of the present disclosure.

As shown in FIG. 1, the memory package structure 100 includes a substrate 110, a memory chip 140, resistors R and a molding compound 170. The memory chip 140 is located on the top surface 111 of the substrate 110. The two resistors R are located on the top surface 111 of the substrate 110 and at two opposite sides of the memory chip 140. The molding compound 170 formed on the top surface 111 of the substrate 110 and further covers the memory chip 140 and the resistors R.

The substrate 110 includes a plurality of pins 120. As shown in the cross-section view of FIG. 1, in this embodiment, the pins 120 are solder balls located on the bottom surface 112 of the substrate 110.

In this embodiment, the substrate 110 further includes circuits 130. In FIG. 1, the circuits 130 are formed within the substrate 110 and extend to the top surface 111 and the bottom surface 112. The pins 120 are located on the bottom surface 112 and connected to the circuits 130, and the pins 120 can be connected to other elements on the top surface 111 of the substrate 110 through the circuit 130. In this embodiment, the pins 120 are connected to the resistors R on the top surface 111 through the circuits 130 within the substrate 110.

In this embodiment, each resistors R has a resistance less than 100 ohm. In some embodiment, each resistors R has a resistance in a range of 1 ohm and ohm. In some embodiment, the resistors R include SMD (Solder-Mask-Defined) resistors integrated on the substrate 110, and the SMD resistors has resistance equal to 01005 in SMD resistor unit.

As shown in FIG. 1, the substrate 110 includes a through hole 115. The memory chip 140 includes a plurality of bonding pads 150, which are located on the backside of the memory chip 140. The bonding pads 150 of the memory chip 140 face to the top surface 111 of the substrate 110, and the bonding pads 150 are aligned with the through hole 115. Conductive wires 135 connect the bonding pads 150 to the circuits 130. Specifically, the bonding pads 150 located within the through hole 115 and connected to the circuits 130 on the bottom surface 112 through conductive wires 135.

The resistors R on the top surface 111 are electrically connected between the bonding pads 150 and the pins 120.

Figure 2A:
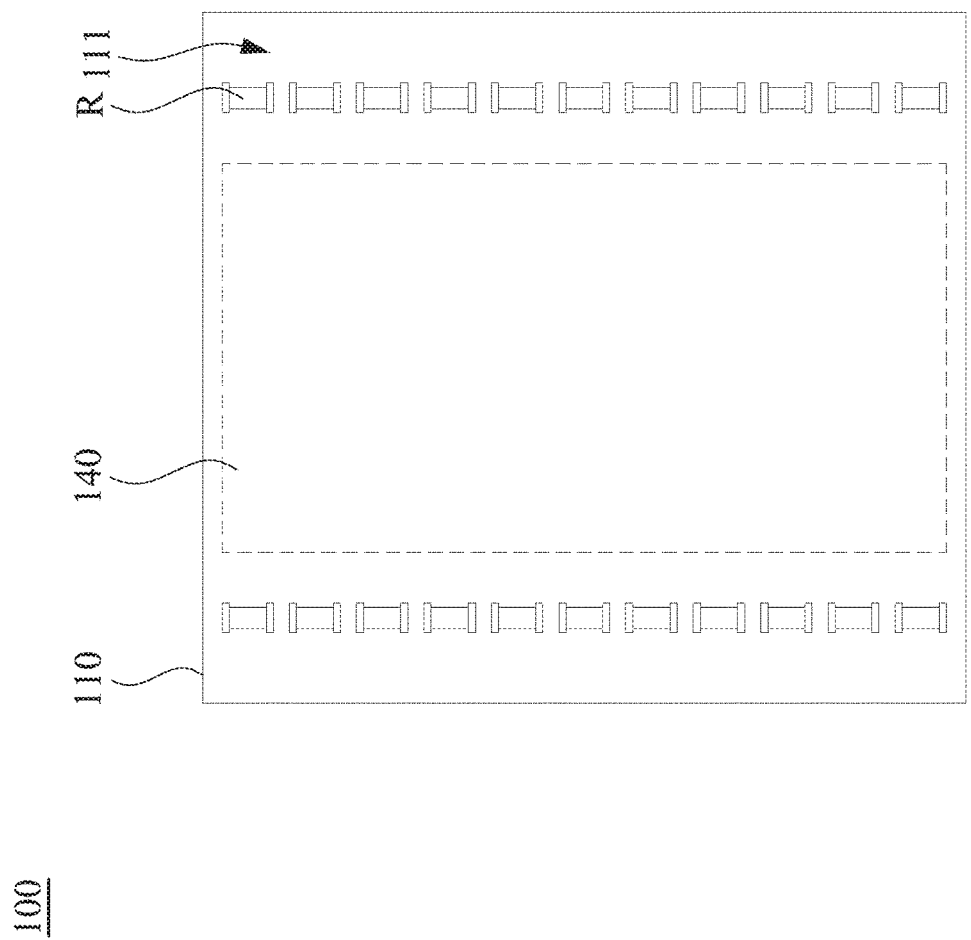
FIG. 2A is a top view of a memory package structure according one embodiment of the present disclosure.
Figure 2B:
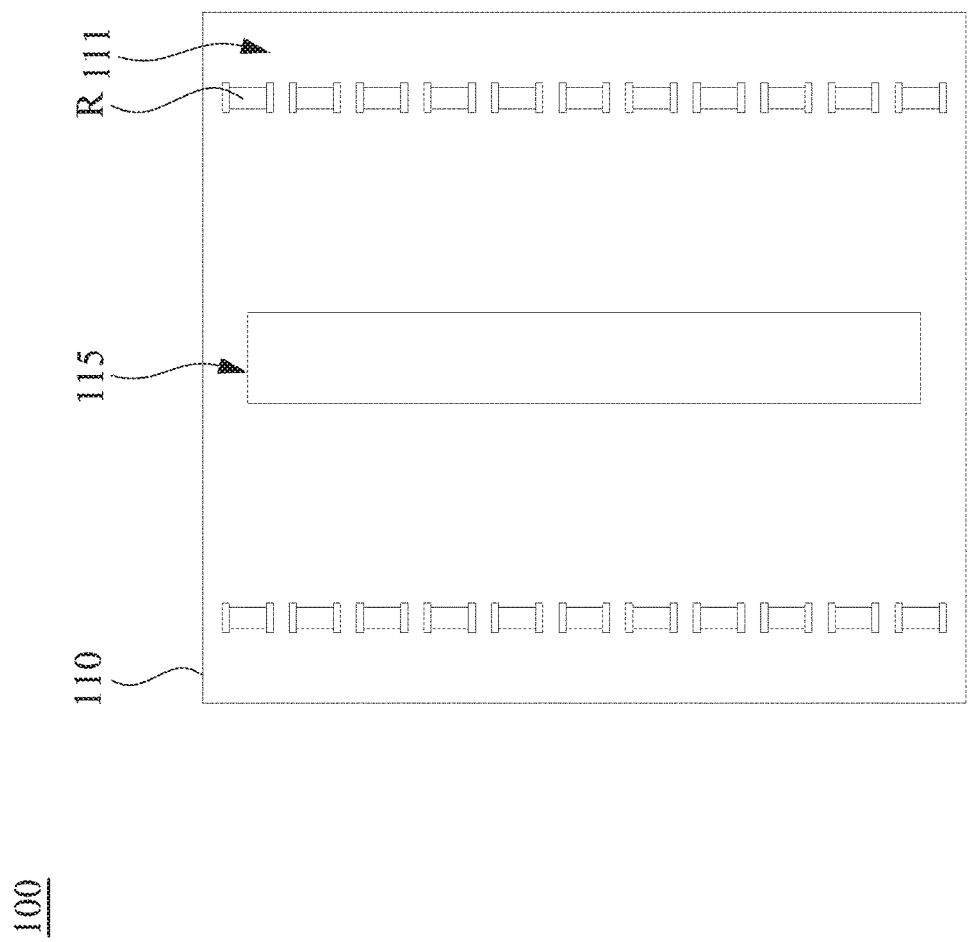
FIG. 2B is a top view of the substrate and the resistors shown in FIG. 2A.

FIG. 2A is a top view of a memory package structure 100 according one embodiment of the present disclosure. FIG. 2B is a top view of the substrate 110 and the resistors R shown in FIG. 2A. For illustrative purpose, the molding compound 170 and a part of the circuits 130 shown in FIG. 1 are not illustrated in FIGS. 2A and 2B.

As shown in FIG. 2A, the memory chip 140 and the resistors R are located on the top surface 111 of the substrate 110, and the resistors R are located at two opposite sides of the memory chip 140. In this embodiment, eleven of the resistors R are located at one side of the memory chip 140 and arranged along the edge of the memory chip 140, another eleven of the resistors R are located at another side of the memory chip 140 and arranged along the another edge of the memory chip 140, and the area of the top surface 111 is reduced. In other words, the resistors R are arranged on two straight lines extending along the two opposite sides of the memory chip 140. In this embodiment, the resistors R include SMD (Solder-Mask-Defined) resistors integrated on the substrate 110.

In FIG. 2B, the memory chip 140 shown in FIG. 2A is removed. The rectangular through hole 115 is presented at the center of the substrate 110, and the resistors R are located near the edge of the substrate 110. As mentioned above, the pins 120 are located on the bottom surface 112 of the substrate 110, and the bonding pads 150 of the memory chip 140 are connected to the resistor R through the circuit 130 on bottom surface 112 of the substrate 110. Therefore, the total area of the substrate 110 can be reduced since only memory chip 140 and resistors R are disposed on the top surface 111. The total area of the substrate 110 can be reduced to only a little greater than the area of the memory chip 140 and the resistors R.

The memory package structure 100 is used to store data. The memory chip 140 can be a DRAM die having memory cells with storing bits, and the memory chip 140 can store data. The bonding pads 150 of the memory chip 140 are used to input/output data or applied to have driving voltage/grounded voltage or control commands. In this embodiment, the memory package structure 100 integrates the memory chip 140 on the substrate 110, and each of the bonding pads 150 is connected to a corresponding one of the pins 120 of the substrate 110.

Therefore, users can apply driving voltage, control commands or input/output data to the bonding pads 150 of the memory chip 140 through the pins 120 on the substrate 110, and elements used to improve data transmission can be located on the substrate 110 such that the elements respectively connected between the corresponding bonding pads 150 and pins 120. In some embodiments, the memory package structure 100 can be connected to a controller, and the resistors R are connected between the memory chip 140 and the controller.

In this embodiment, the resistors R of the memory package structure 100 used to improve the overshoot/undershoot phenomenon for input/output data signal, and some of the bonding pads 150 are connected to the pins 120 through the resistors R. In other words, one of the bonding pads, a resistor R and a corresponding one of the pins 150 are connected on series. For details, refer to the following discussion.

Figure 3:
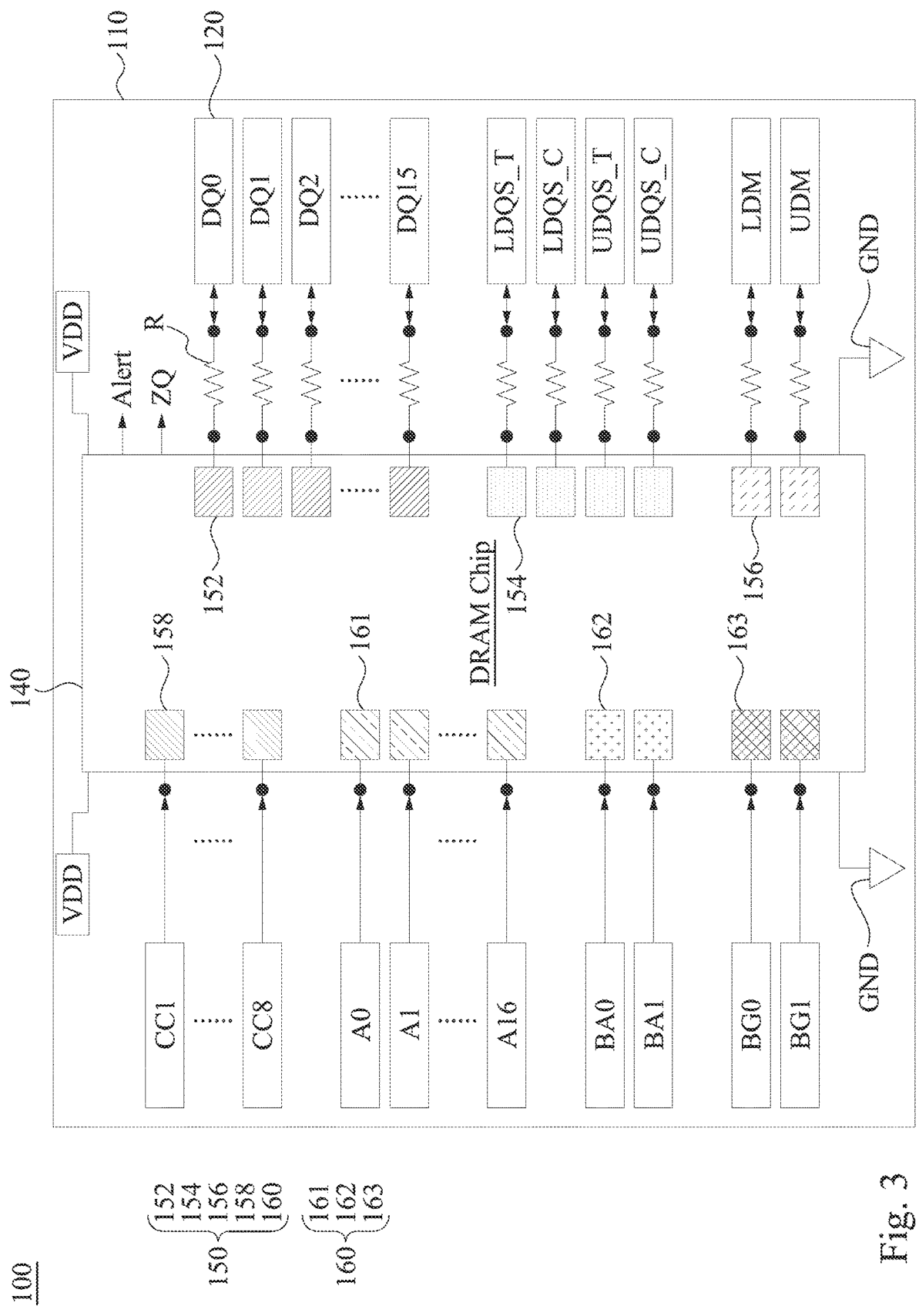
FIG. 3 is a schematic block diagram of a memory package structure according to one embodiment of the present disclosure.

FIG. 3 is a schematic block diagram of a memory package structure 100 according to one embodiment of the present disclosure.

As shown in FIG. 3, in this embodiment, a plurality of pins 120 with different functions are located on the substrate 110, and the memory chip 140 is also located on the substrate 110. In this embodiment, the memory chip 140 is a DRAM chip. Further, the memory chip 140 is a DDR4 DRAM chip, and the memory chip 140 includes a plurality of bonding pads 150. In FIG. 3, the memory chip 140 is connected to driving voltage VDD used for power supply and grounded voltage GND to work. Further, the memory chip 140 can output alert message (through "Alert") and ZQ calibration message used for ZQ calibration (through "ZQ"), as illustrated in one-way arrows on Figure.

In this embodiment, the pins 120 include sixteen data pins DQ0, DQ1, DQ2, DQ3, DQ4, DQ5, DQ6, DQ7, DQ8, DQ9, DQ10, DQ11, DQ12, DQ13, DQ14 and DQ15, four data strobe pins LDQS_T, LDQS_C, UDQS_T and UDQS_C, two data mask pins LDM and DM, eight control command pins CC1, CC2, CC3, CC4, CC, CC6, CC7 and CC8, and addressing pins including seventeen address pins A0, A1, A2, A3, A4, A5, A6, A7, A8, A9, A10, A11, A12, A13, A14, A15, A16 and A17, two bank address pins BA0 and BA1, and two bank group address pins BG0 and BG1. Correspondingly, the bonding pads 150 include sixteen data pads 152, four data strobe pads 154, two data mask pads 156, eight control command pads 158, and addressing pads 160. The addressing pads 160 include seventeen address pads 161, two bank address pads 162 and two bank group pads 162. To simplify, only some of the pins 120 and bonding pads 150 are present on the FIG. 3. However, the number of the bonding pads 150 and the pins 120 are not limited to this embodiment.

The data pads 152 are used to receive the data signal from data pins or transfer the data signal from the memory chip 140. As shown in FIG. 3, the sixteen data pads 152 are respectively connected to the sixteen data pins DQ0-DQ15, and the data pads 152 receive/transfer the data signal through the data pins DQ0-DQ15. The bidirectional signal transmissions between the data pads 152 and the data pins DQ0-DQ15 are illustrated as double arrows. Therefore, each of the data pads 152, a corresponding resistor R and a corresponding one of the data pins DQ0-DQ15 are connected in series.

The data strobe pads 154 are used to provide a differential pair signaling for the data signal during a read process and a write process of the memory chip 140. The data mask pads 156 are used to input a data mask signal to the memory chip 140, and the data mask signal is used to mask a part of the data pads 152 such that the masked data pads 152 cannot receive/transfer data signal. In FIG. 3, the data strobe pads 154 are respectively connected to the data strobe pins LDQS_T, LDQS_C, UDQS_T and UDQS_C, and the data mask pads 156 are respectively connected to the data mask pins LDM and UDM.

In this embodiment, the resistors R are connected between the data pads 152 and data pins DQ0-DQ15. Further, there are resistors R connected between the data strobe pads 154 and data strobe pins LDQS_T, LDQS_C, UDQS_T and UDQS_C and connected between the data mask pads 156 and the data mask pins LDM and UDM. Therefore, in this embodiment, a number of the resistors R is equal to a total sum of the data pads 152, the data strobe pads 154 and data mask pads 156. In other words, in this embodiment, the number of the resistors R is the total sum of the data pins DQ0-DQ15, the data strobe pins LDQS_T, LDQS_C, UDQS_T and UDQS_C and the data mask pins LDM and UDM. In this embodiment, the total sum of the data pins DQ0-DQ15, the data strobe pins LDQS_T, LDQS_C, UDQS_T and UDQS_C and the data mask pins LDM and UDM is twenty-two, and twenty-two resistors R are located on the substrate 110 in FIG. 2.

Figure 4:
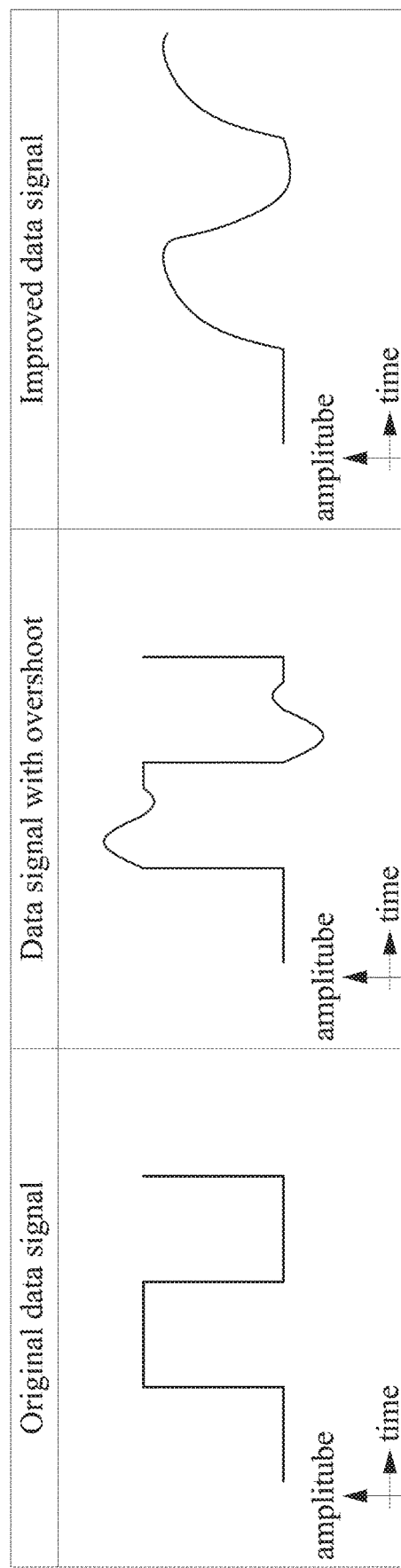
FIG. 4 is a table illustrating data signal improvement according to one embodiment of the present disclosure.

The resistors R connected between bonding pads 150 and the pins 120 can improve the overshoot/undershoot phenomenon of the high frequency data signal. Reference is made by FIG. 4. FIG. 4 is a table illustrating data signal improvement according to one embodiment of the present disclosure.

In FIG. 4, the horizontal axis is time and the vertical axis is voltage amplitude of the data signal. As shown in FIG. 4 the original data signal can be a square wave. FIG. 4 illustrates square waves in one period. However, if the frequency of the square wave is too high, overshoot (and corresponding undershoot) phenomenon appears when the memory chip 140 inputs the data signal directly. The middle of the table illustrates the data signal with overshoot if the original data signal is a square wave. The data signal with overshoot exceeds the original data signal in the beginning. It is because that the memory chip 140 cannot follow the changing of the data signal. The quick slope changing of the amplitude for the original data signal causes the exceeding amplitude of the data signal with overshoot. Then, the undershoot appears in the data signal, amplitude of the data signal with overshoot is lower than the amplitude of the original data signal, and the data signal with overshoot returns to the original data signal finally. Similar phenomenon repeats again. Therefore, in one period, two times of the overshoots and undershoots happened in the data signal. The overshoots and undershoots form a unexpected signal changing, which includes an extra signal distortion with respect to the straight line on the original data signal and can cause error in a reading or writing process for a memory chip.

The right of the table in FIG. 4 illustrates the improved data signal, which is corresponding to the data signal input memory chip 140 in the memory package structure 100. The resistors R are connected between the data pads 152 and the data pins DQ0-DQ15 consume the overshoot amplitude. Therefore, the signal distortion in data signal can be reduced, and the improved data signal in one period can be a monotonous up-down-up-down wave, which is more similar to the original square wave data signal with respect to the data signal with overshoot.

In another point of view, the resistors R and intrinsic capacitances of the memory chip 140 form a RC (resistor-capacitor) circuit, and amplitude of the improved data signal is present an RC charging curve, which is a monotonous up-down-up-down wave. After the resistors R are added, amplitude of the improved data signal will increase based on the charging constant (equal to resistance of a resistor R multiplying the intrinsic capacitance of the memory chip 140) and lead to a slower amplitude increasing, so that the overshoot/undershot would not appear. Therefore, it avoids the error in a reading or writing process for the memory chip 140.

Return to FIG. 3. In this embodiment, the memory chip 140 is a DDR4 memory chip, and the memory chip 140 transfer data signal on both the rising and falling edges of the clock signal (through one of the command control pins CC1-CC8). Therefore, the resistors R are connected to the data pads 152, the data strobe pad 154 and the data mask pads 156, which are directly related to the data signal transmission.

In FIG. 3, the bonding pads 150 of the memory chip 140 further includes command control pads 158 used to input control signal to the memory chip 140 and addressing pads 160 configured to achieve an addressing function to read/ write a selected memory cell in the memory chip 140, as illustrated in one-way arrows on Figure.

The command control pads 158 respectively connected to the 8 command control pins CC1-CC8 directly. The address pads 161 respectively connected to the 17 address pads A0-A16 directly. In this embodiment, there is no resistor R connected between the command control pads 158 and command control pins CC1-CC8.

The 17 address pads 161 respectively connected to the address pins A0-A16. The two bank address pads 162 respectively connected to the bank address pins BA0 and BA1 directly. The two bank group pads 163 are respectively connected to the bank group pins BG0 and BG1 directly. Through the address pads 161, the bank address pads 162 and the bank group pads 163, users can select a memory cell of the memory chip 140 to read/write data signal. Similarly, there is no resistor R connected between the address pads 161 and the address pads A0-A16, between the bank address pads 162 and the bank address pins BA0 and BA1, or between the bank group pads 163 and the bank group pins BG0 and BG1.

Figure 5:
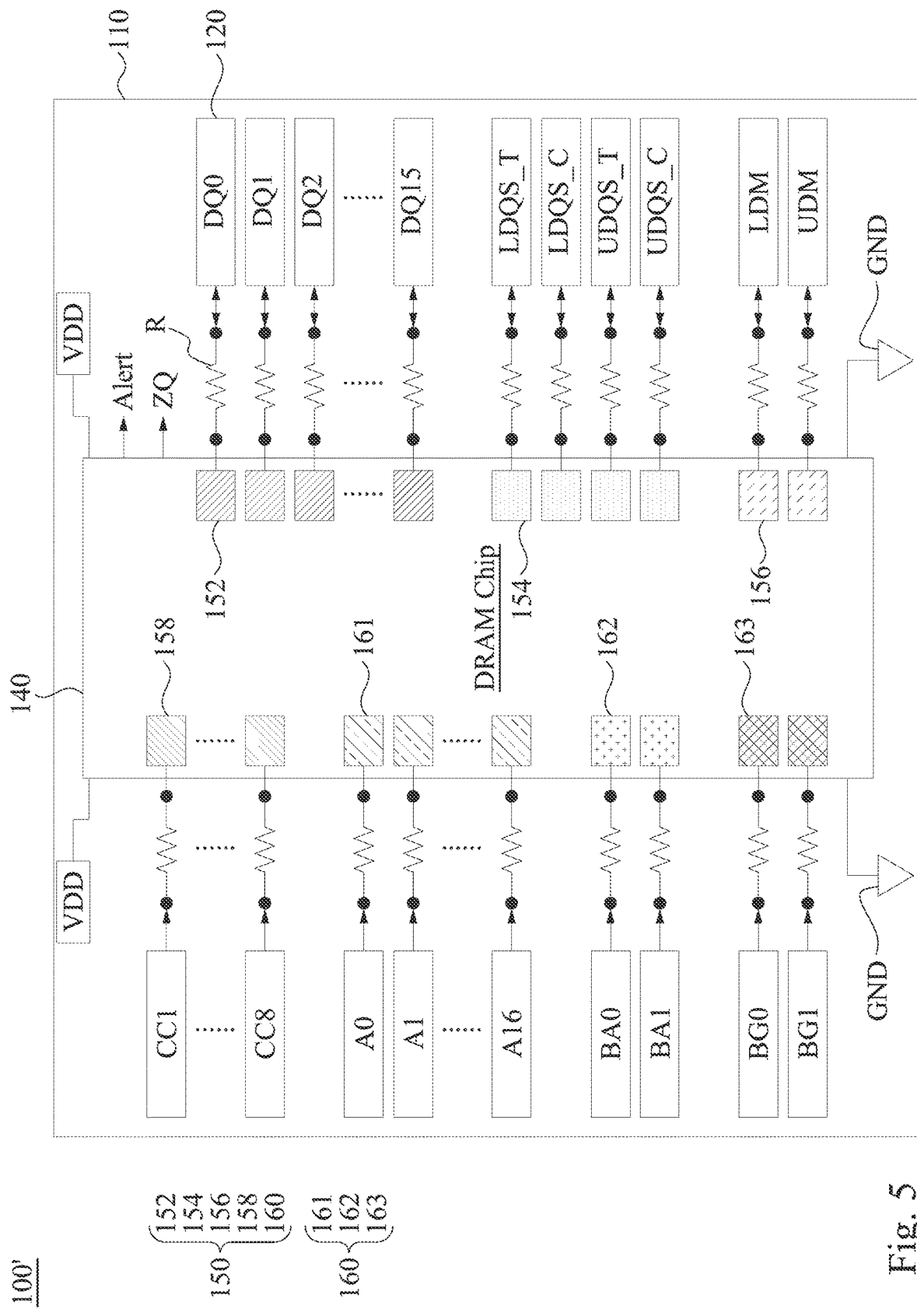
FIG. 5 is a schematic block diagram of a memory package structure according to another embodiment of the present disclosure.

FIG. 5 is a schematic block diagram of a memory package structure according to another embodiment of the present disclosure. In this embodiment, each of the command control pads 158 can be connected to a corresponding one of the command control pins CC1-CC8 through a resistor R, and each of the addressing pads 160 (including address pads 161, bank address pads 162 and bank group pads 163) is connected to a corresponding addressing pins (including the address pins A0-A16, the bank address pins BA0 and BA1 and the bank group pins BG0 and BG1). Therefore, it avoids the overshoot/undershoot phenomenon appearing in the command control signal through the command control pads 158 of the memory chip 140 and the addressing error through the addressing pads 160 of the memory chip 140.

In summary, the present disclosure provides a memory package structure used to store data/information. The memory package structure includes a memory chip integrated on a substrate, and each of bonding pads of the memory chip can be connected to a corresponding one of pins located on the substrate through a resistor. Users can input/output high frequency data signal to the memory chip through the pins on the substrate. Therefore, overshoot/undershoot phenomenon appearing of the input/output of data signal can be reduced through the resistors. In other words, the resistors can be configured in a bidirectional data transmission channel to reduce overshoot/undershoot phenomenon. The signal distortion in the data signal can be reduced, and it avoids data signal errors in a reading/writing process for the memory chip. Therefore, by using resistors in series with each signal transmission channel between memory chip and other elements (e.g. controller) and pre-packaging the resistors in the memory package structure, transmission quality of the data signal is improved and waveform of the data signal is stabilized.

The foregoing has described features of several embodiments so that those skilled in the art may better understand the description in various aspects. It will be apparent to those skilled in the art that various modifications and variations can be made to the structure of the embodiments of the present disclosure without departing from the scope or spirit of the present disclosure. In view of the foregoing, it is intended that the present disclosure cover modifications and variations, provided they fall within the scope of the following claims.

What is claimed is:

1. A memory package structure, comprising:
   a substrate having a plurality of pins, wherein the pins comprise a plurality of data pins used to transfer data signal;
   a memory chip disposed on the substrate, wherein a plurality of bonding pads is disposed on the memory chip, and the bonding pads comprise a plurality of data pads used to receive the data signal from data pins or transfer the data signal from the memory chip; and
   a plurality of resistors located on the substrate, wherein each data pad is connected to a corresponding one of the data pins through a corresponding one of the resistors, wherein the memory chip and the resistors are located on a top surface of the substrate, and the resistors are located on two opposite sides of the memory chip.

2. The memory package structure of claim 1, wherein each resistor has a resistance less than 100 ohm.

3. The memory package structure of claim 1, further comprises:
   a molding compound located on the top surface and covering the memory chip and the resistors.

4. The memory package structure of claim 1, wherein the bonding pads of the memory chip further comprise a plurality of command control pads, the command control pads are used to input control signal to the memory chip, and each of the command control pads is connected to a corresponding one of the pins through a corresponding one of the resistors.

5. The memory package structure of claim 1, wherein the bonding pads of the memory chip further comprise a plurality of addressing pads configured to achieve an addressing function to read/write a selected memory cell in the memory chip, and each addressing pad is connected to a corresponding one of the pins through a corresponding one of the resistors.

6. The memory package structure of claim 1, wherein the substrate comprises a top surface and a bottom surface, the memory chip and the resistors are located on the top surface, the pins are solder balls located on the bottom surface, the resistors are connected to the solder balls and the bonding pads of the memory chip through a plurality of circuits within the substrate, and the circuits extend to the top surface and the bottom surface.

7. The memory package structure of claim 6, wherein the substrate further comprises a through hole, the bonding pads of the memory chip face the top surface and align with the through hole, and the bonding pads of the memory chip are connected to the circuits on the bottom surface through the through hole.

8. The memory package structure of claim 1, wherein the bonding pads of the memory chip further comprise a plurality of data strobe pads and data mask pads, the data strobe pads are used to provide a differential pair signaling for the data signal during a read process and a write process of the memory chip, the data mask pads are used to input or output data mask signal to the memory chip, and each of the data strobe pads and the data mask pad is connected to a corresponding one of the pins through a corresponding one of the resistors.

9. The memory package structure of claim 8, wherein a number of the resistors is equal to a total sum of the data pads, the data strobe pads and the data mask pads.

* * * * *